United States Patent
Teo et al.

(10) Patent No.: US 7,727,856 B2
(45) Date of Patent: Jun. 1, 2010

(54) SELECTIVE STI STRESS RELAXATION THROUGH ION IMPLANTATION

(75) Inventors: Lee Wee Teo, Singapore (SG); Shiang Yang Ong, Singapore (SG); Jae Gon Lee, Singapore (SG); Vincent Leong, Singapore (SG); Elgin Quek, Singapore (SG); Dong Kyun Sohn, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 545 days.

(21) Appl. No.: 11/615,980

(22) Filed: Dec. 24, 2006

(65) Prior Publication Data

US 2008/0150037 A1  Jun. 26, 2008

(51) Int. Cl.
*H01L 21/76* (2006.01)
(52) U.S. Cl. .................. 438/434; 438/437; 438/450; 438/424; 438/E29.286
(58) Field of Classification Search ......... 438/424–454; 257/506–513
See application file for complete search history.

(56) References Cited

U.S. PATENT DOCUMENTS

| | | | |
|---|---|---|---|
| 5,498,564 A * | 3/1996 | Geissler et al. | 438/247 |
| 5,960,276 A * | 9/1999 | Liaw et al. | 438/224 |
| 6,258,697 B1 | 7/2001 | Bhakta | |
| 6,284,626 B1 | 9/2001 | Kim | |
| 6,498,383 B2 | 12/2002 | Beyer | |
| 6,657,276 B1 | 12/2003 | Karlsson et al. | |
| 6,780,730 B2 * | 8/2004 | Lin | 438/424 |
| 6,882,025 B2 | 4/2005 | Yee et al. | |
| 6,984,569 B2 | 1/2006 | Karlsson | |
| 2004/0212035 A1 | 10/2004 | Yeo et al. | |
| 2005/0014344 A1 * | 1/2005 | Choi | 438/433 |
| 2005/0020022 A1 | 1/2005 | Grudowski | |
| 2005/0073022 A1 | 4/2005 | Karlsson et al. | |
| 2005/0156274 A1 * | 7/2005 | Yeo et al. | 257/510 |
| 2006/0166419 A1 * | 7/2006 | Shimoyama et al. | 438/173 |

OTHER PUBLICATIONS

Cha-Hsin Lin, et. al., Effect of strain on p-channel metal-oxide-semiconductor field-effect-transistor current enhancement using stress-modulated silicon nitride films; Applied Physics Letters 87, 262109 (2005); pp. 87-262109-1 to 262109-3.

* cited by examiner

*Primary Examiner*—Dung A. Le
(74) *Attorney, Agent, or Firm*—Horizon IP Pte Ltd (57) ABSTRACT

A first example embodiment comprises the following steps and the structure formed therefrom. A trench having opposing sidewalls is formed within a substrate. A stress layer having an inherent stress is formed over the opposing trench sidewalls. The stress layer having stress layer sidewalls over the trench sidewalls. Ions are implanted into one or more portions of the stress layer to form ion-implanted relaxed portions with the portions of the stress layer that are not implanted are un-implanted portions, whereby the inherent stress of the one or more ion-implanted relaxed portions of stress layer portions is relaxed.

55 Claims, 11 Drawing Sheets

SELECTIVE STI STRESS RELAXATION THROUGH ION IMPLANTATION

BACKGROUND OF INVENTION

1) Field of the Invention

This invention relates generally to semiconductor devices and more particularly to strained channel transistors and the fabrication of same.

2) Description of the Prior Art

Size reduction of metal-oxide-semiconductor field-effect transistors (MOSFET), including reduction of the gate length and gate oxide thickness, has enabled the continued improvement in speed performance, density, and cost per unit function of integrated circuits over the past few decades.

To enhance transistor performance further, strain may be introduced in the transistor channel for improving carrier mobilities. Therefore, strain-induced mobility enhancement is another way to improve transistor performance in addition to device scaling. There are several existing approaches of introducing strain in the transistor channel region.

SUMMARY OF THE INVENTION

One or more exemplary embodiments of the present invention provide a structure and a method of manufacturing a device with selective STI stress which is characterized as follows. A first example embodiment comprises the following steps and the structure formed therefrom. A trench having opposing sidewalls is formed within a substrate. A stress layer having an inherent stress is formed over the opposing trench sidewalls. The stress layer having stress layer sidewalls over the sidewalls of the trench sidewalls. Ions are implanted into one or more portions of the stress layer to form ion-implanted relaxed portions. The portions of the stress layer that are not implanted are un-implanted portions, whereby the inherent stress of the one or more ion-implanted relaxed portions of stress layer portions is relaxed or reduced. The ions are preferably comprised of boron (B) containing ions. In a second example embodiment, we use angled implants to selectively implanted into portions of a stress layer over an isolation trench sidewall. We can form N-FET and P-FET with their channels orientated at about right angles to each other. This allows proper stress to be selectively applied to the P-FET and N-FET channels.

In a further exemplary embodiment, there is provided a semiconductor structure, comprising:
  a substrate;
  a trench within the substrate, the trench having opposing trench walls; and
  a stress layer over the opposing trench walls, the stress layer having an inherent tensile stress; the stress layer including one or more relaxed stress layer portions having implanted ions therein.

Further exemplary embodiments may be defined by the claims.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 7F are mixed cross-sectional side view and top down plan views for illustrating a method for fabricating selectively relaxed strained transistors according to a second exemplary embodiment of the present invention with FIGS. 1, 2, 3A, 4A, 5, 6, 7A and 7F being top down plan views and FIGS. 3B, 4B, 4C, 7B, 7C, 7D and 7E being cross-sectional side views.

DETAILED DESCRIPTION OF THE EXAMPLE EMBODIMENTS

The example embodiments of the present invention will be described in detail with reference to the accompanying drawings. The example embodiments provide a selectively or completely relaxed transistor(s) and methods of forming the same. Some of the example embodiments describe a tensile stress liner layer. Also, other embodiments can use a compressive stress liner layer.

A. First Example Embodiment

Figure 8:
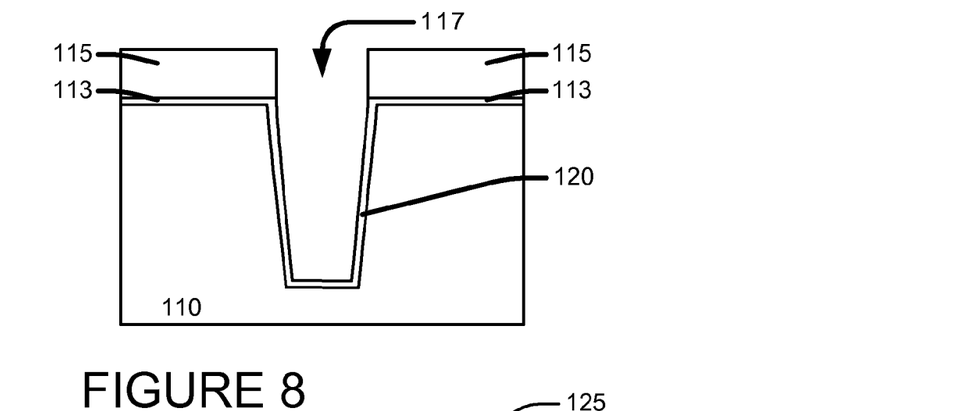
FIGS. 8 through 13 are cross-sectional side views for illustrating a method for fabricating selectively relaxed strained transistors according to a first exemplary embodiment of the present invention.

FIG. 8, an exemplary embodiment of the present invention, shows a cross sectional view of a substrate 110. Substrate 110 may be, for example, a semiconductor substrate comprised of, for example, silicon (Si), silicon on insulator (SOI), Ge or SiGe or any suitable material.

We form pad oxide 113 and STI mask layer 115 over substrate 110. STI mask layer 115 may be comprised of SiN, for example.

We form STI trench 117 in substrate 110 thru pad oxide layer 113 and STI mask layer 115.

Next we may perform an optional pre-liner oxide clean. Then, we form liner 120 within STI trench 117. Liner 120 may be comprised of, for example, oxide or oxynitride and is preferably comprised of oxide. Liner 120 may be formed by an oxidation. Liner 120 may have a thickness between about 30 and 150 angstroms for example.

B. Stress Layer

Figure 9:
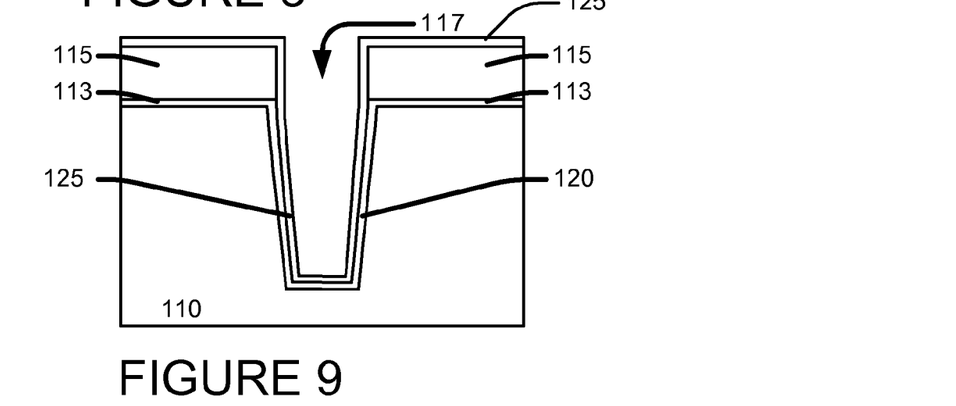

Referring to FIG. 9, in an exemplary embodiment of the present invention, we form stress layer (stress liner layer) 125 over the walls of trench 117/liner 120. Stress layer 125 may be comprised of, for example, nitride, silicon oxynitride or silicon nitride and is preferably comprised of silicon nitride.

Stress layer 125 has an inherent stress that exerts a compressive stress within at least the proximate adjacent substrate 110. Thus, stress layer 125 may have an inherent tensile stress (e.g. tensile stress layer) (also see below).

Stress layer 125 may have a thickness between about 50 and 250 angstroms for example.

C. Ion Implant

Figure 10:
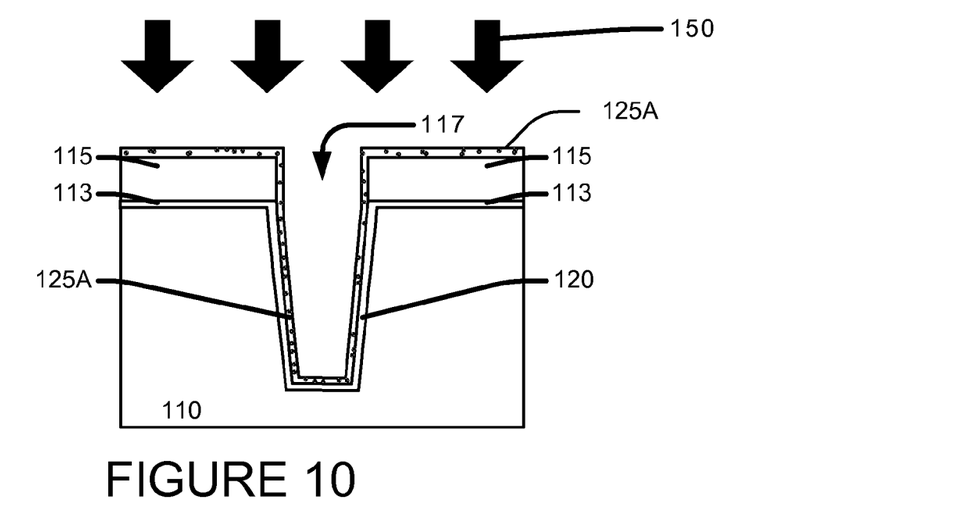

Referring to FIG. 10, in an exemplary embodiment of the present invention, we next implant stress layer 125 with ions 150 to alter the characteristics of stress layer 125 to form implanted stress layer 125A. It is thought that the ion implant (I/I) relaxes the intrinsic stress in stress layer 125. Examples of ions-containing implants that can be used are Ge, Si, P and B. Relaxes means less or lower stress. Any ion that reduces the stress of the stress film can be used. Preferably any ion (e.g., B-containing ions) can be used that reduces the stress of the stress film after implant and substantially retains the relaxed stress after subsequent anneals.

Boron Containing Ion Implantation

The ion implant may preferably implant B-containing ions. The ion implant process may comprise, for example, implanting B, $BF_2$ or $B_2F_5$ ions and preferably $BF_2$ and at a dose between about 1E14 and 5E15 ions per square centimeter at an energy between about 1 and 25 KeV. B-containing ions are preferred since it is thought that a stress layer comprised of SiN (e.g., substantially SiN) will be relaxed with the B-containing I/I and also remain relaxed after subsequent anneals. It is thought stable B—N bonds can form in the stress layer after anneals.

The ion implantation process may be a conventional beamline ion implantation process, a plasma immersion ion implantation (PIII), or any other ion implantation process known and used in the art.

D. Optional Anneal

Figure 11:
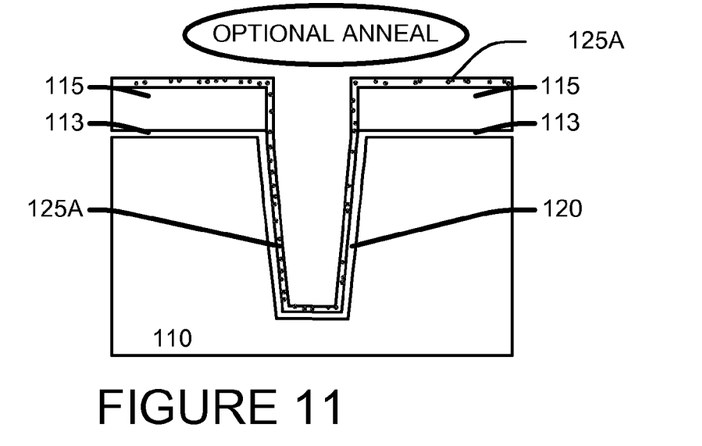

Referring to FIG. 11, in an exemplary embodiment of the present invention, while an optional anneal 151 may be performed which should keep the implanted film 125A relaxed. Optional anneal 151 is not necessary. Also, subsequent processing will introduce high temperature anneal processes/steps.

Stress layer 125 may be annealed sometime after the ion implantation 150.

Figure 12:
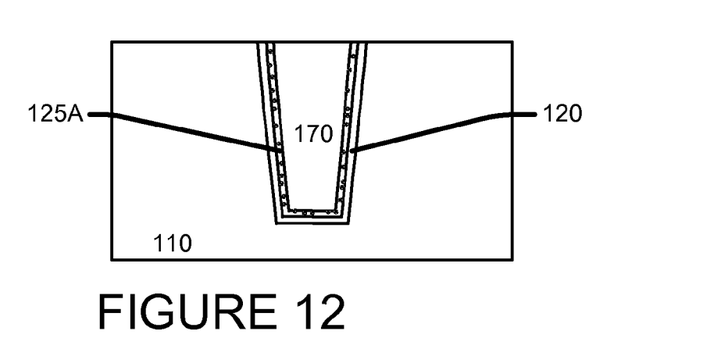

For example, an optional anneal process can be performed after the ion implantation 150 and before the formation of STI isolation layer 170 (see FIG. 12, for example). In another option, the ion-implanted stress layer 125A may be annealed during a subsequent anneal, such as a S/D anneal, silicide anneal, any anneal during normal subsequent device processing, etc.

The optional anneal process may be performed at a temperature of, for example, between about 750 and 1100 C for a time between about, for example, 1 second and 5 minutes and preferably at about 900 degrees C. for about 30 seconds. It is noted that other anneals would be effective as long as they meet these minimum requirements or have such sufficient thermal cycle. It is noted that the implanted SiN film may relax even further after the anneal possibly because of the formation of B—N bond (not Si—N bonds).

The stress in tensile stress layer 125A after the I/I and anneal (at whatever stage) is preferably between about 0.0 and 0.2 GPa.

Example of a Tensile Stress Layer

For a stress layer 125 that has an intrinsic tensile stress, the ion implant reduces intrinsic stress. For example, a tensile stress layer 125 before the ion implant may have, for example, a tensile stress between about 0.5 and 1.4 GPa.

After the ion implantation and any optional anneal, the implanted portions of tensile stress layer 125A may have a tensile stress between about 0.0 and 0.2 GPa, for example. Any optional, or other, anneal does not substantially change/alter the stress in the implanted or non-implanted stress layer portions.

The implanted relaxed portions of the stress layer can have a stress that is from about 0% to 40% of the non-implanted tensile stress layer.

After anneal, the unimplanted portions of the stress layer still have a tensile stress between about 0.5 and 1.4 GPa. The anneal probably will not appreciably change the stress in the implanted stress layer portion and the tensile stress could remain the same as before, or higher than before, for the non-implanted regions.

E. STI Isolation

Referring the FIG. 12, in an exemplary embodiment of the present invention, we fill the trench 117 with an insulation material to form STI isolation layer 170.

The isolation layer may be comprised of an oxide, for example.

Next, pad oxide 113, STI mask layer 115 and the portions of ion-implanted stress layer 125A above pad oxide layer 113 are removed, preferably during a CMP (chemical mechanical polishing) step (or other appropriate planarization step) to form the structure shown in FIG. 12.

F. Form FET on Substrate

Figure 13:
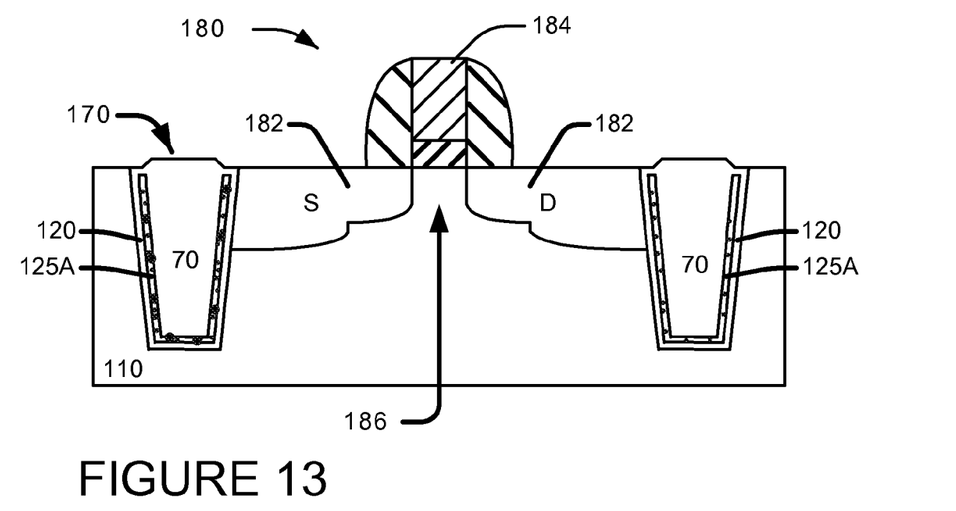

Referring to FIG. 13, in an exemplary embodiment of the present invention, we form an FET (field-effect-transistor) 180 on an active area of substrate 110 that may be defined as between adjacent STI structures having STI layers 170 from FIG. 12. FET 180 can be comprised of S/D (source/drain) regions 182, gate 184, and channel region 186.

Implanted stress layers 125A within the STI structures at this point reduces or neutralizes the stress on channel region 186.

G. Another Option

I/I Stress Liners Around N-FET Devices—not Around P-FET Device

Another option in an exemplary embodiment of the present invention would be to implant the stress liners surrounding NFET devices and mask the stress liners around PFET devices. This may enhance hole mobility in P-FETs and the reduce stress in N-FET channels (increase electron mobility).

H. Comments

A feature of the first example embodiment is the B-containing ion implant 150 that reduces the intrinsic stress in stress layer 125 (forming ion-implanted relaxed stress layer 125A). B-containing implanted relaxed stress layer 125A has the important property of remaining relaxed even after any subsequent anneal processes. In contrast, stress layer 125 implanted with other ion implants (e.g., Ge, P+, As+, Sb+) increase their intrinsic stress after subsequent anneals performed at anneals temperatures higher than about 500 degrees C. For example a tensile stress layer implanted with other ion implants (e.g., Ge, P+, As+, Sb+) increase their tensile stress after subsequent anneals performed at anneals higher than about 500 degrees C.

Second Example Embodiment

Figure 1:
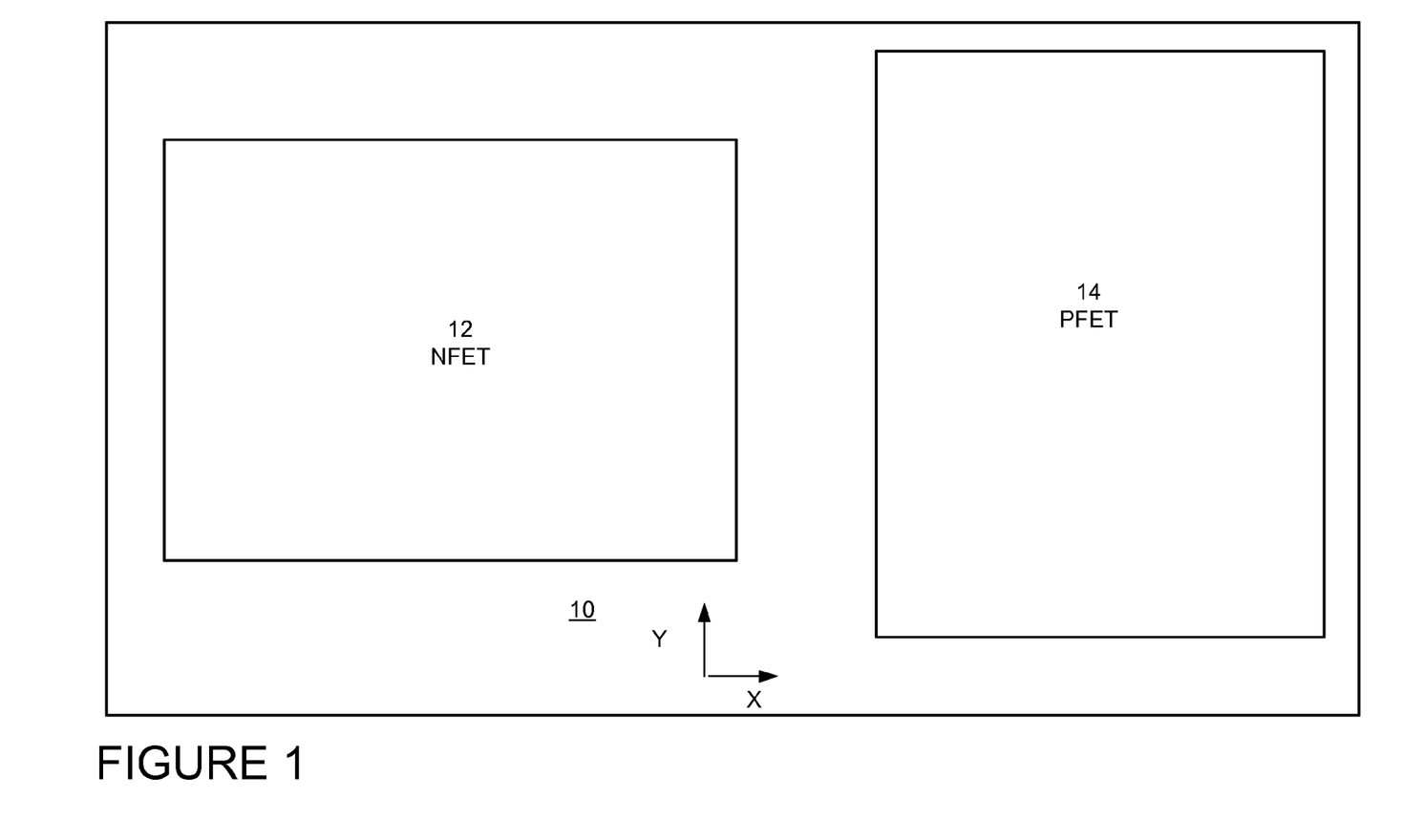

FIG. 1, in an exemplary embodiment of the present invention, illustrates substrate 10 having one or more metal-oxide-semiconductor field-effect transistor (MOSFET)/field effect transistor (FET) regions 12, 14 therein. Region 12 is an N-metal-oxide-semiconductor field-effect transistor (N-MOSFET) region and region 14 is a P-metal-oxide-semiconductor field-effect transistor (P-MOSFET) region. While two regions 12, 14 are illustrated in FIG. 1, there may only be one region or more than two regions that may be all N-MOSFET regions, all P-MOSFET regions or a combination of N-MOSFET regions and P-MOSFET regions, for example. It is noted that P-MOSFET regions and N-MOSFET regions may be P-FET regions and N-FET regions, respectively.

Substrate 10 may be, for example, a semiconductor substrate comprised of, for example, silicon (Si), silicon on insulator (SOI), Ge or SiGe. Substrate 10 may be any suitable semiconductor substrate.

Figure 2:
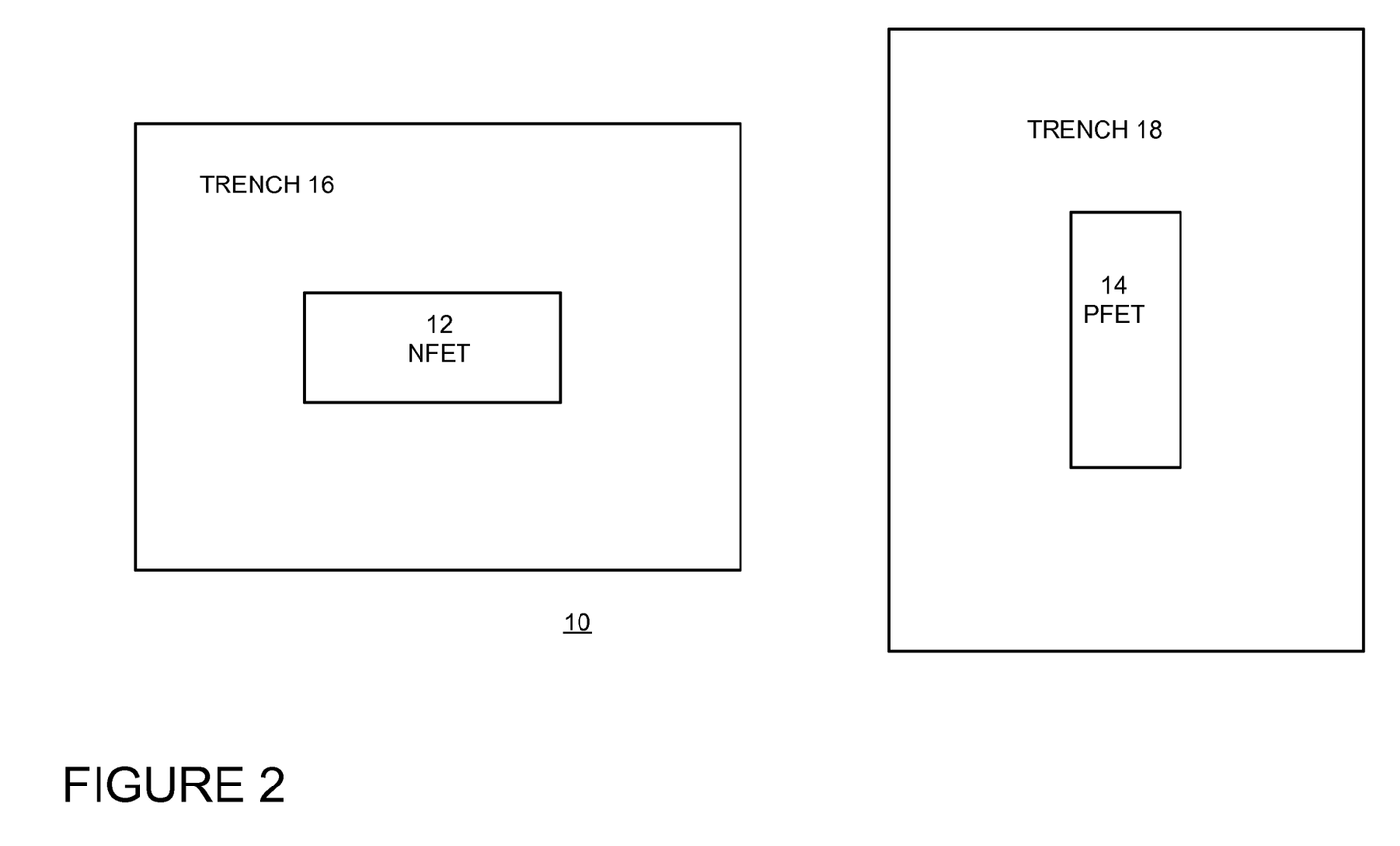

As shown in FIG. 2, in an exemplary embodiment of the present invention, respective shallow trench isolation (STI) trenches 16, 18 are formed about the periphery of N-MOSFET region 12 to form N-MOSFET active region 12 and P-MOSFET region 14 to form P-MOSFET active region 14. STI trenches 16, 18 may each have a width of, for example, from about 0.05 to 10 μm and more preferable from about 0.05 to 1 μm. STI trenches 16, 18 may each have a depth of, for example, from about 2000 to 4000 angstroms and more preferably from about 2500 to 3500 angstroms.

The sidewalls of the respective trenches may be angled from between about 90 degrees (vertical) and 80 degrees and are preferably about 90 degrees. See cross sectional views in FIGS. 3B, 4B etc. The trenches and the angle of the implant can be configured to have the implants substantially into the sidewalls of the stress layer.

Trenches 16 18 may be formed by, for example, using a masking layer (such as pad oxide layer 15 and a masking layer 17 (e.g. a nitride masking layer) (see FIG. 3B, for example)) as an etch mask. It is noted that pad oxide layer 15 may be optional and may also be comprised of other suitable materials.

Figure 3A:
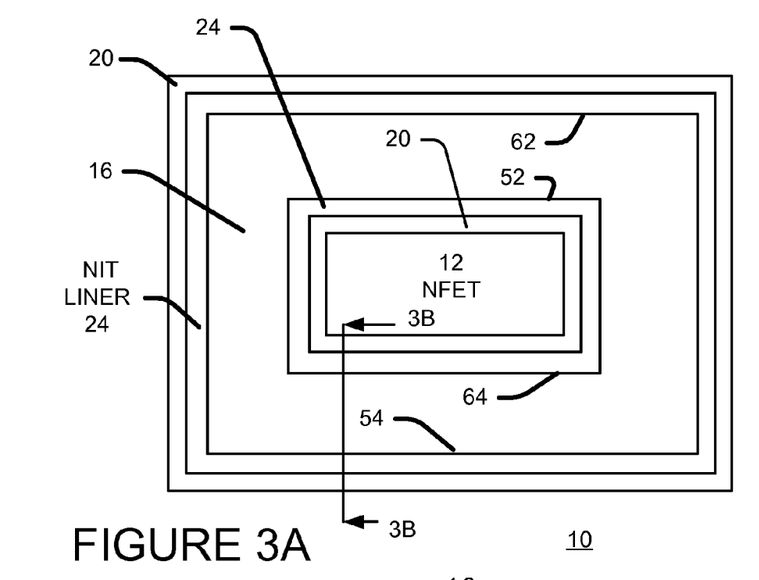
Figure 3B:
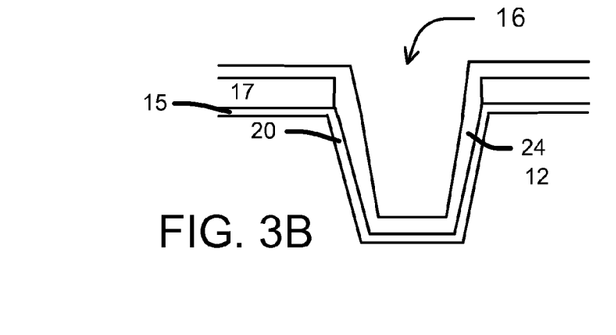

As shown in FIGS. 3A and 3B, in an exemplary embodiment of the present invention, a pre-liner oxide clean process may be performed followed by the formation of respective oxide liners 20, 22 on STI trenches 16, 18. Oxide liners 20, 22 may be, for example, the oxides of underlying substrate 10. For example, for a silicon substrate 10, oxide liners 20, 22 may be comprised of silicon oxide. Oxide liners 20, 22 may be formed by, for example, oxidation of the exposed STI trench walls. Each oxide liner 20, 22 may have a thickness of, for example, from about 10 to 110 angstroms, and more preferably from about 50 to 80 angstroms. Liners 20, 22 may be comprised of other suitable materials.

I. Stress Liners

As shown in FIGS. 3A and 3B, in an exemplary embodiment of the present invention, respective inherent tensile stress (e.g., nitride) liners 24, 26 are formed over respective sidewalls of trenches 16, 18 and over respective dielectric (oxide) liners 20, 22. Stress liners 24, 26 may be comprised of, for example, silicon nitride, silicon oxynitride or a silicon nitride/silicon oxynitride stack and are preferably silicon nitride. A dielectric layer can be formed over the substrate. Then a stress liner can be formed over the dielectric layer.

Each nitride liner 24, 26 may have a thickness of, for example, from about 50 to 250 angstroms, preferably from about 75 to 125 angstroms and more preferably about 100 angstroms. Nitride liners 24, 26 each may have an inherent stress (as will be discussed in greater detail below) which in turn exerts a at least a uniaxial stress (x and y directions) into respective N-MOSFET channel(s) and P-MOSFET channel (s). For example, an inherent tensile nitride liner 24, 26 (tensile nitride liners 24, 26) exerts a compressive stress within respective N-MOSFET and P-MOSFET channels 42, 44.

For example, a compressive stress within N-MOSFET channel can degrade the N-MOSFET Idsat (reducing its electron mobility) while a uniaxial compressive stress within P-MOSFET channel 44 improves the P-MOSFET Idsat (enhancing its hole mobility). Hole mobility for a P-MOSFET is increased with a compressive stress parallel to the P-MOSFET channel width. Also, a uniaxial compressive stress in the direction perpendicular to the channel width of a NFET may not significantly degrade NFET performance. This may be true for either a high compressive stress (HS), that is a compressive stress of greater than about −2 Gpa, or a low compressive stress (LS), that is a stress of from about −0.2 GPa to −0.5 GPa It is noted that a further adverse effect of high STI stress is the possibility of the formation of (silicon) defects that could propagate along the STI edge during the STI process and leading to leakage issues and serious yield concerns.

J. I/I (Ion Implant)

It is noted that the ion implant or Boron-containing (B) ion implantation (I/I) may be a two step method.

K. First I/I

Figure 4A:
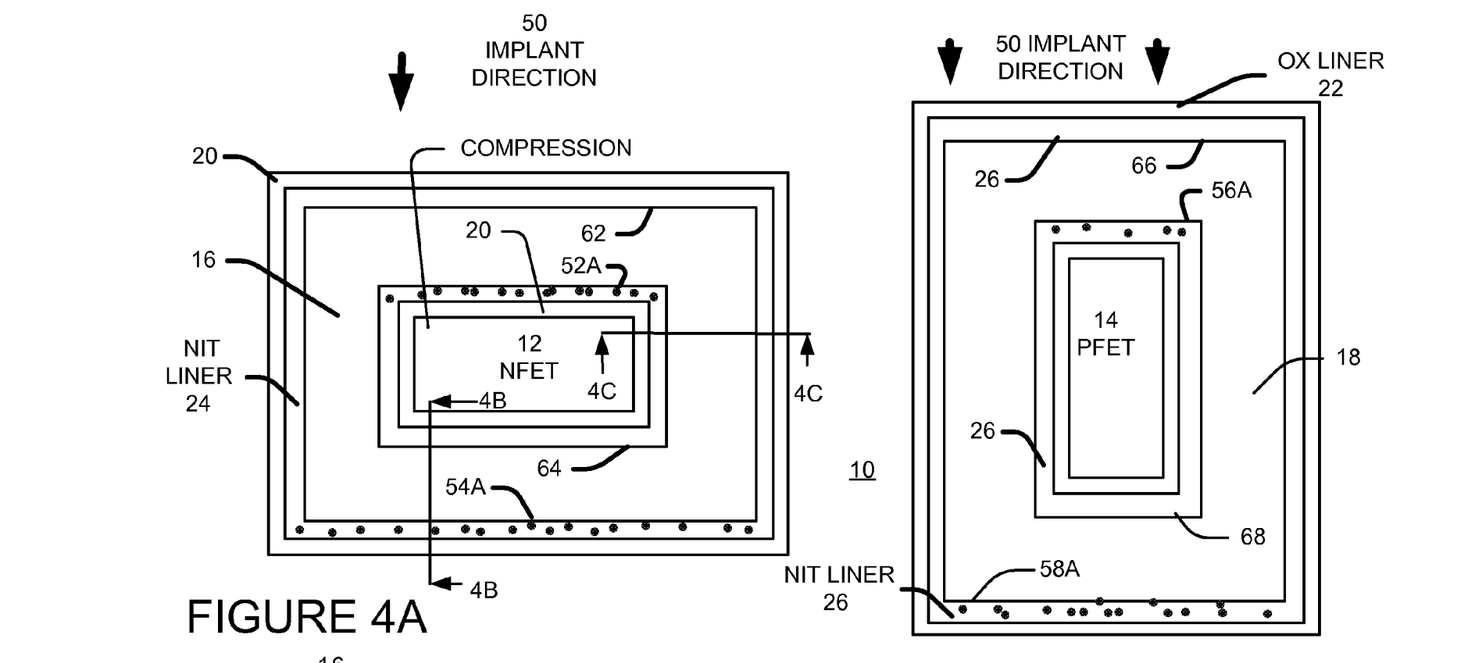

As shown in FIG. 4A, in an exemplary embodiment of the present invention, a first angled ion implantation 50 is performed into portions of tensile stress nitride liners 24, 26 to form ion implanted relaxed portions. Examples of ions of ions-containing implants that can be used are Ge, Si, P and B. Preferably any ion (e.g., B-containing ions) can be used that reduces the stress of the stress film after implant and substantially retains or improves reduced stress in the relaxed stress after subsequent anneals.

Figures 7A, 7B, 7C:
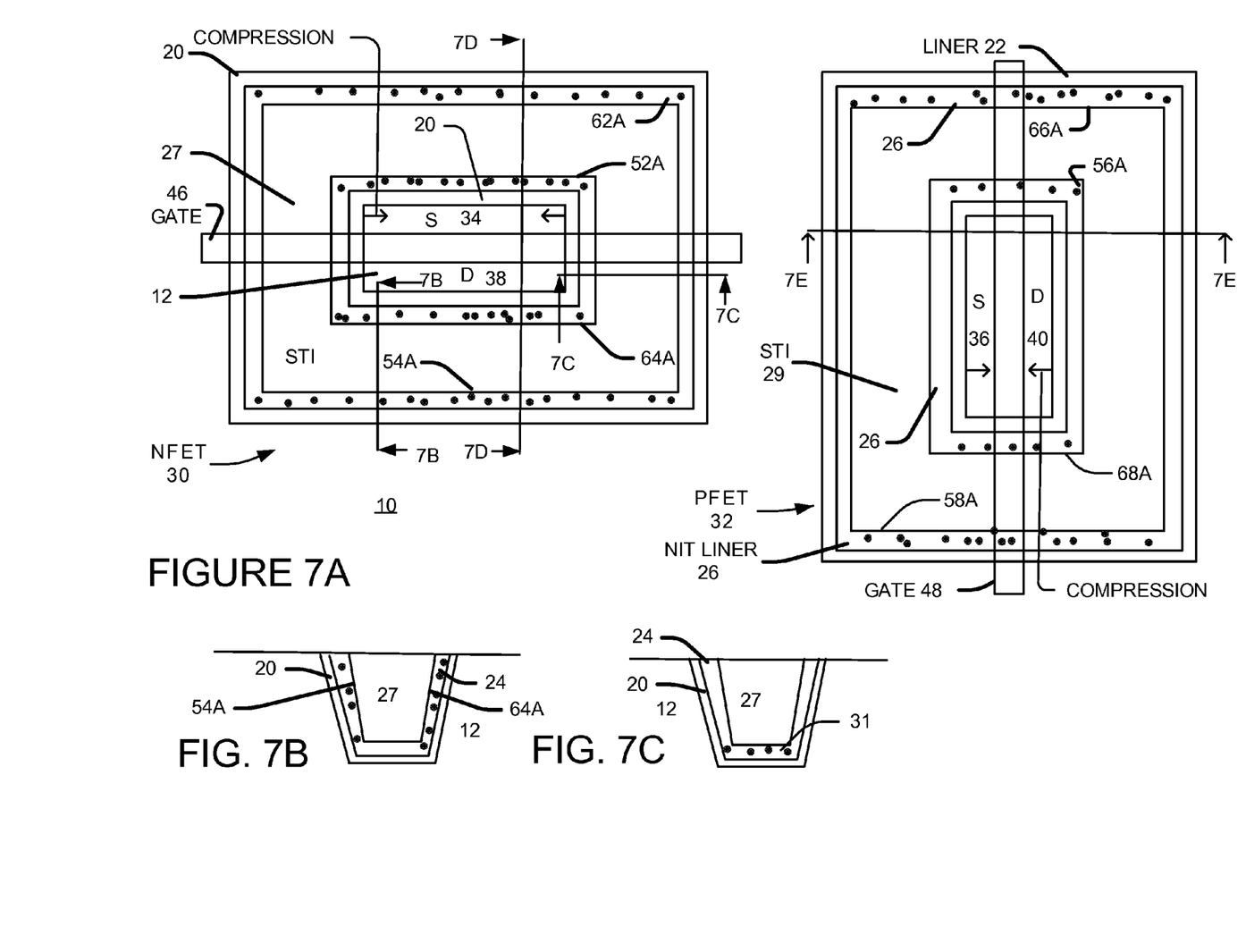

In an exemplary embodiment of the present invention, a preferred first angled boron (B) containing ion implantation 50 is performed into portions of tensile stress nitride liners 24, 26 that is roughly perpendicular to the to-be-formed channel width of N-MOSFET 30 within active region 12 (and are thus roughly parallels to the to-be-formed channel width of P-MOSFET 32 within active region 14) (also see, for example, FIG. 7A). This first B-containing angled ion implant 50 may be conducted at an angle of, for example, from about 2 to 45 degrees and more preferably about 7 degrees such that ions are implanted into one sidewall 52, 54; 56, 58 of each opposing nitride liner 24, 26 for each respective N-FET region 12/P-FET region 14.

Figure 4B:
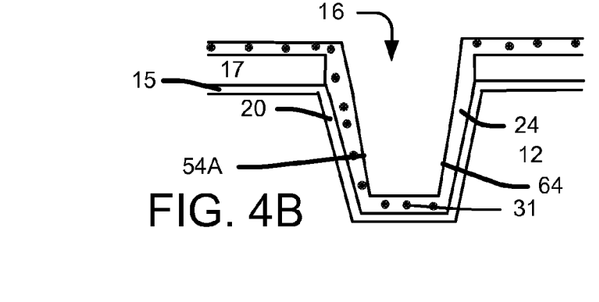
Figure 4C:
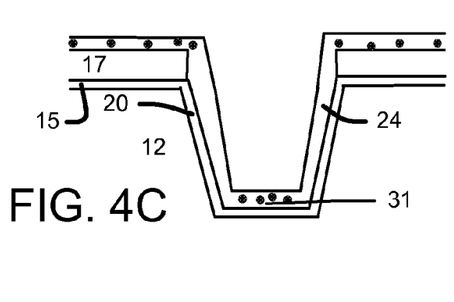

It is noted that any implantation within the bottom of trenches 16, 18 and over the top of respective regions 12, 14 is not shown to simplify the top down FIGS. (i.e., e.g., FIGS. 4A, 5, 6, 7A and 7F) but is representatively shown in FIGS. 4B and 4C and 7C (i.e., implanted bottoms 31. It is noted that any implanted bottoms of trenches 16, 18 will not appreciably affect the stress on the channel region as significantly as the sidewalls of the trenches.

FIG. 4B is a cross sectional view along line "4B-4B" in FIG. 4A.

FIG. 4C is a cross sectional view along line "4C-4C" in FIG. 4A.

It is noted that the use of an angled implant 50 ensures that only one side (sidewall 52, 54; 56, 58) of each opposing nitride liner 24, 26 is implanted.

As the trench sidewalls are angled, the tilted implant 50 will only implant on one side of the STI/opposing nitride liners 24, 26 (i.e., e.g., for formation of implanted sidewalls 52A, 54A; 56A, 58A). The remainder of the sides/sidewalls 62, 64; 66 68 will either be shadowed or perpendicular to the ion implantation 50 and hence will not get implanted.

L. Second I/I

Figure 5:
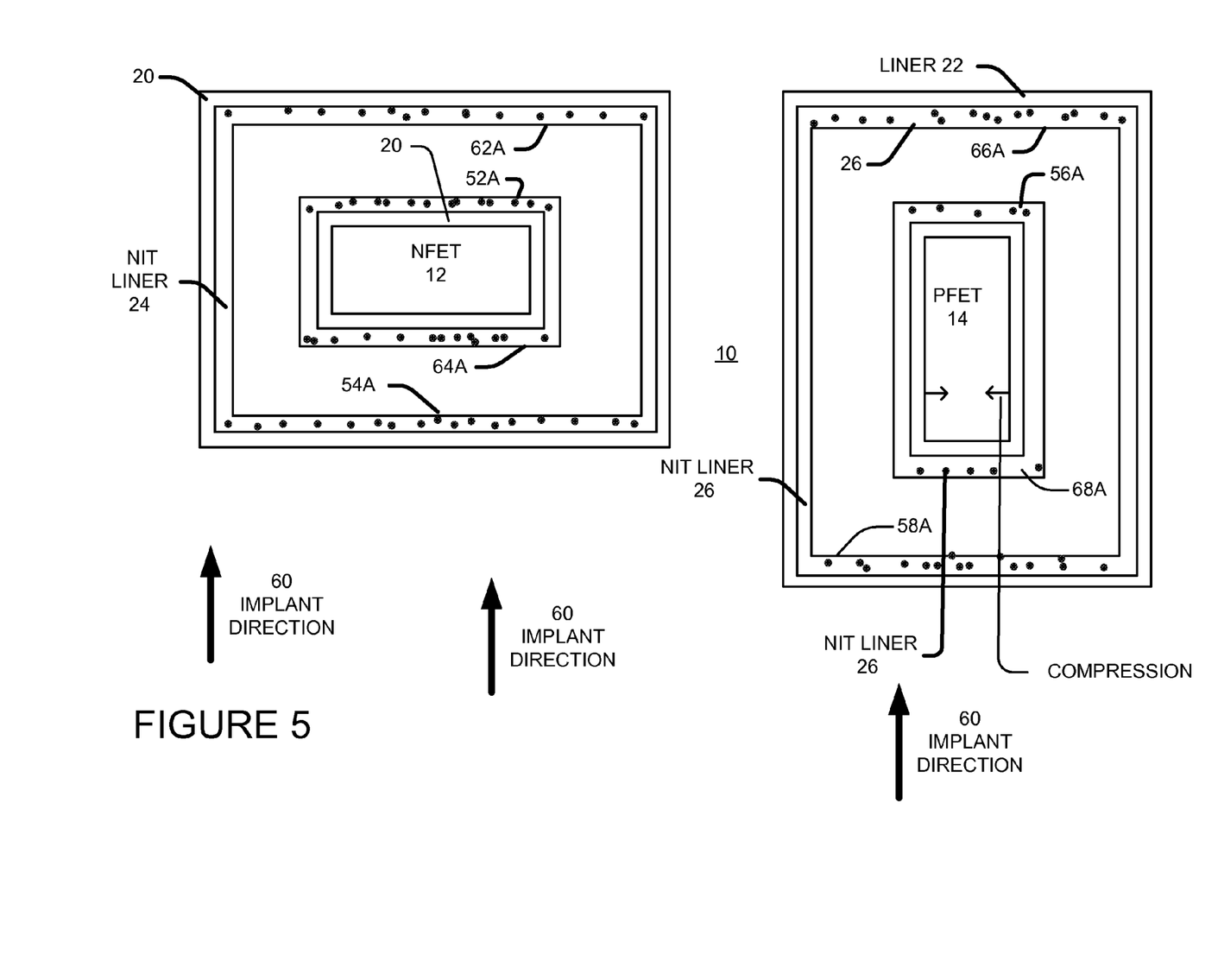

As shown in FIG. 5, in an exemplary embodiment of the present invention, a second angled boron-containing (B) ion implantation 60 is performed into portions of tensile stress nitride liners 24, 26 that roughly parallel the to-be-formed channel length of N-MOSFET 30 within active region 12 (and are thus about perpendicular to the to-be-formed channel length of P-MOSFET 32 within active region 14). This second B-containing angled ion implant 60 may be conducted at an angle of, for example, from about 2 to 45 degrees and more preferably about 7 degrees such that ions are implanted into the other sidewall 62, 64; 66, 68 of each opposing nitride liner 24, 26 for each respective N-FET region 12/P-FET region 14 so that both nitride liner sidewalls 52, 62; 54, 64; 56, 66; 58, 68 of the selected opposing STI trench portions are implanted with B ions to form implanted nitride liner portions 52A, 62A; 54A, 64A; 56A, 66A; 58A, 68A (see FIGS. 6 and 7A et al., for example).

For the first and second angled ion implantations 50, 60 the B-containing ions may be, for example, B ions, $BF_2$ ions or $B_2F_5$ ions. The first and second B-containing ion implantations 50, 60 may be conducted at a dosage of, for example, from about 1 E 14 to 5 E 15 atoms/cm$^2$ and more preferably from about 1 E 15 to 2 E 15 atoms cm$^2$. The first and second B containing ion implantations 50, 60 may be conducted at an energy of, for example, from about 1 to 25 KeVs and more preferably from about 3 to 10 KeVs.

The ion implantation process may be a conventional beamline ion implantation process, a plasma immersion ion implantation (PIII), or any other ion implantation process known and used in the art.

The first and second B ion implantations 50, 60 may be conducted to a concentration of, for example, from about 1 E 14 to 5 E 15 atoms/cm$^3$ and more preferably from about 1 E 15 to 2 E 15 atoms/cm$^3$ within implanted nitride liner portions 24A, 26A.

The B containing ion implant can be detected by SIMS since the nitride film would likely contain B and N peaks that are above normal back ground levels, that is >$10^{17}$ cm$^{-3}$. For example, a B dose may be from about 1E18 to 1E20 atoms/sq-cm and an N dose may be from about 1E21 to 1E22 atoms/sq-cm.

XPS can be used to check for the presences of B—N bonding. For example, a B—N peak may be at about 190.4 eV.

It is thought that the ion implant (I/I) relaxes the intrinsic stress in I/I implanted stress layer portions 24A, 26A.

It is noted that in one aspect of an exemplary embodiment of the present invention, only the first angled B-containing ion-implant 50 may be performed. That is, for example, only one of the opposing side walls [portions of tensile stress nitride liners 24, 26 that is roughly perpendicular to the to-be-formed channel width of N-MOSFET 30 within active region 12 (and are thus roughly parallels to the to-be-formed channel width of P-MOSFET 32 within active region 14)] may be implanted with ions.

M. Optional Anneal

Figure 6:
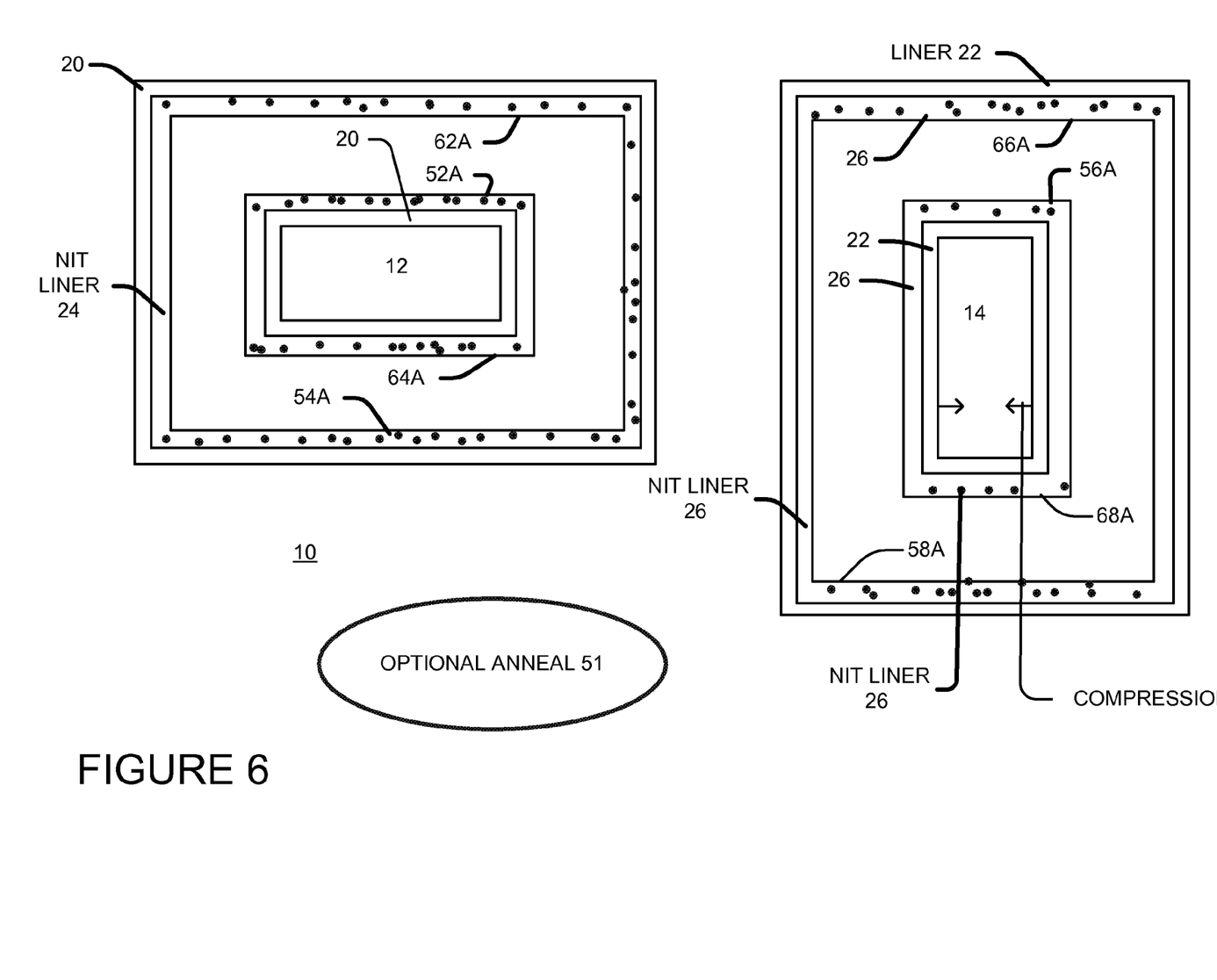

As shown in FIG. 6, in an exemplary embodiment of the present embodiment, the structure may be subjected to an optional anneal 51 at a temperature of, for example, from about 810 to 990 degrees C. for from about 27 to 33 seconds and preferably at about 900 degrees C. for about 30 seconds. It is noted that other anneals would be effective as long as they meet these minimum requirements or have such sufficient thermal cycle.

This anneal 51 is optional as other subsequent anneals may be sufficient such as, for example, a S/D anneal, silicide anneal, etc. Optional anneal 51 should keep the implanted film portions 24A, 26A relaxed, it is not necessary as subsequent processing will introduce high temperature anneal processes/steps.

Any optional, or other, anneal does not substantially change/alter the stress in the implanted or non-implanted stress layer portions. The anneal probably will not appreciably change the stress in the implanted stress layer portion and the tensile stress could remain the same as before, or higher than before, for the non-implanted regions.

N. STI Oxide

Referring to FIG. 7A, in an exemplary embodiment of the present invention, we fill respective STI trenches 16, 18 with an STI isolation layer 27, 29. Isolation layer 27, 29 may be formed of oxide, for example. We may remove any pad oxide 15 and mask layers 16, for example.

O. Form FETs (MOSFETs) 30, 32

In an exemplary embodiment of the present invention, the orientation of the N-FET/N-MOSFET channel length(s) is/are roughly perpendicular, i.e. about 90°, to the orientation of the P-FET/P-MOSFET channel length(s) as illustrated in FIG. 7A.

As shown in FIG. 7A, in an exemplary embodiment of the present invention, an N-MOSFET (FET) 30 may be formed within N-MOSFET (FET) active region 12 and a P-MOSFET (FET) 32 may be formed within P-MOSFET (FET) active region 14. Each MOSFET (FET) 30, 32 has a respective source 34, 36, drain 38, 40, channel (under the gates between the respective source 34, 36 and drain 38, 40), and gate 46, 48 overlying the respective channel. Each channel has a channel width through which the electrical current (electrons (N-MOSFET)/holes (P-MOSFET)) move between source 34, 36 and drain 38, 40 for electrons (N-MOSFET) (and visa versa for holes (P-MOSFET)), and a channel length perpendicular to the channel width. That is, the channel width is the direction between the source and drain and defines the direction by which the electrical current travels between the source and drain, and the channel length is the direction roughly perpendicular to the channel width.

As shown in FIG. 7A the B containing ion implantations 50, 60 into the selected nitride liner sidewalls and any optional or later anneal form respective relaxed nitride liner portions (implanted stress layer portions) 52A, 62A; 54A, 64A; 56A, 66A; 58A, 68A which lessens the stress exerted into respective N-MOSFET channel(s) and P-MOSFET channel(s).

The un-implanted stress layers 24, 26 may exert stresses on the channel regions to improve device performance.

As shown in FIG. 7A, for example, the tensile stress layer 24 exerts a uniaxial compressive force (C) on the N-FET channel in the direction of the channel width.

The tensile stress layer 26 exerts a uniaxial compressive force (C) on the P-FET channel in the channel width direction (direction between S and D).

Since a uniaxial compressive stress in the channel width direction improves P-MOSFET and a uniaxial compressive stress in the channel length direction of the channel (as seen in FIG. 7A) does not degrade N-MOSFET significantly, the layout of the N-MOSFET and P-MOSFET are orthogonal (i.e. at right angles) to each other to improve P-MOSFET performance without sacrificing performance on the N-MOSFETs.

For the N-MOSFET 30 this lessens the degradation of its Idsat and for the P-MOSFET this further improves its Idsat. FIG. 7B, in an exemplary embodiment of the present invention, is a cross section of FIG. 7A at line "7B-7B" and shows a strained nitride liner 24 with B containing ion implants in its sidewalls forming B ion-implanted nitride liner portions 64A, 54A.

FIG. 7C, in an exemplary embodiment of the present invention is a cross section of FIG. 7A at "7C 7C", and it shows a nitride liner 26 without B ion implants (I/I) in its sidewalls.

It is noted that the bottom of the trenches also can get implanted. It is also noted that the trenches need not have vertical walls (see above). Also, the trenches 16 18 can be one trench (communicate with each other). The one trenches can surround the two or more active regions.

Form FETs on Substrate

Figure 7D:
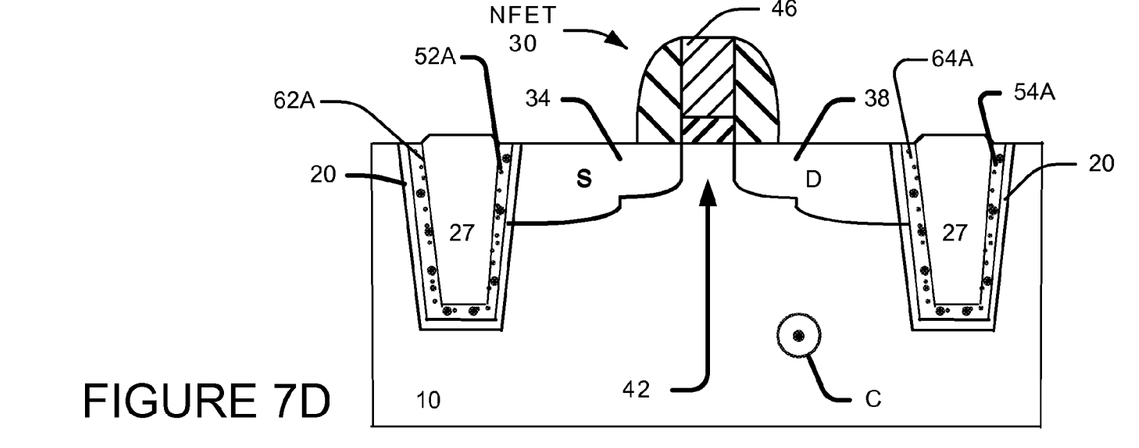

Referring to FIG. 7D, in an exemplary embodiment, a cross sectional view of FIG. 7A along line "7D-7D", N-MOSFET (nFET) 30 is formed over the N-MOSFET active area of substrate 10. N-FET 30 is comprised of S/D regions 34, 38, gate 46 and channel region 42. Implanted stress layer portions 62A, 52A, 64A, 54A combined with non-implanted stress layer portions 24 (see FIG. 7A, for example) causes compressive stress C on channel region 44 (also see FIG. 7A, for example).

Figure 7E:
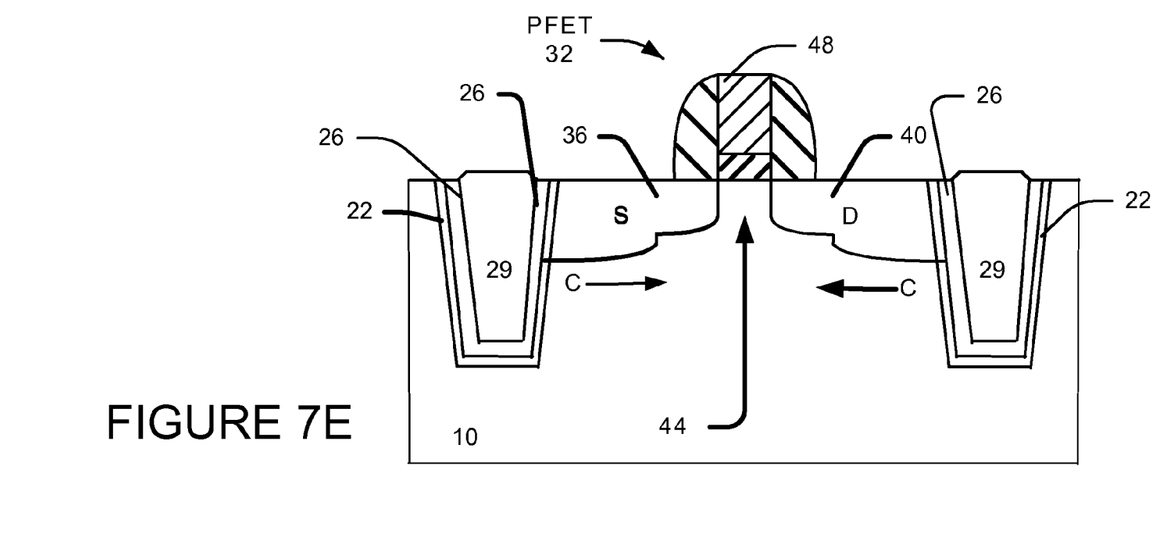

Referring to FIG. 7E, in an exemplary embodiment, a cross sectional view of FIG. 7A along line "7E-7E", P-MOSFET (pFET) 32 is formed over the P-MOSFET active area of substrate 10. P-FET 32 is comprised of S/D regions 36, 40, gate 48 and channel region 44. Implanted stress layer portions 66A, 56A, 68A, 58A (see FIG. 7A, for example) combined with non-implanted layer portions 26 causes compressive stress C on channel region 42 (also see FIG. 7A, for example).

The un-implanted tensile stress layer portions 24 26 can exert a compressive stress in the N-MOSFET and P-MOSFET channels as shown in the following exemplary table:

TABLE

|  | Perpendicular to N-MOSFET 30 Channel Width | Parallel to P-MOSFET 32 Channel Width |
|---|---|---|
| Compressive Stress | from about −0.2 to −1.5 GPa | from about −0.2 to −1.5 GPa |

While FIGS. 1 through 7A, 7B, 7C, 7D and 7E illustrate an N-metal-oxide-semiconductor field-effect transistor (N-MOSFET) and a P-metal-oxide-semiconductor field-effect transistor (P-MOSFET) formed so the respective N-MOSFET(s) channel length(s) are roughly perpendicular to the respective P-MOSFET(s) channel length(s). It is noted that the method of the present invention may be applied to just N-MOSFETs or just P-MOSFETs.

Single Trench Embodiment

FIG. 7F

Figure 7F:
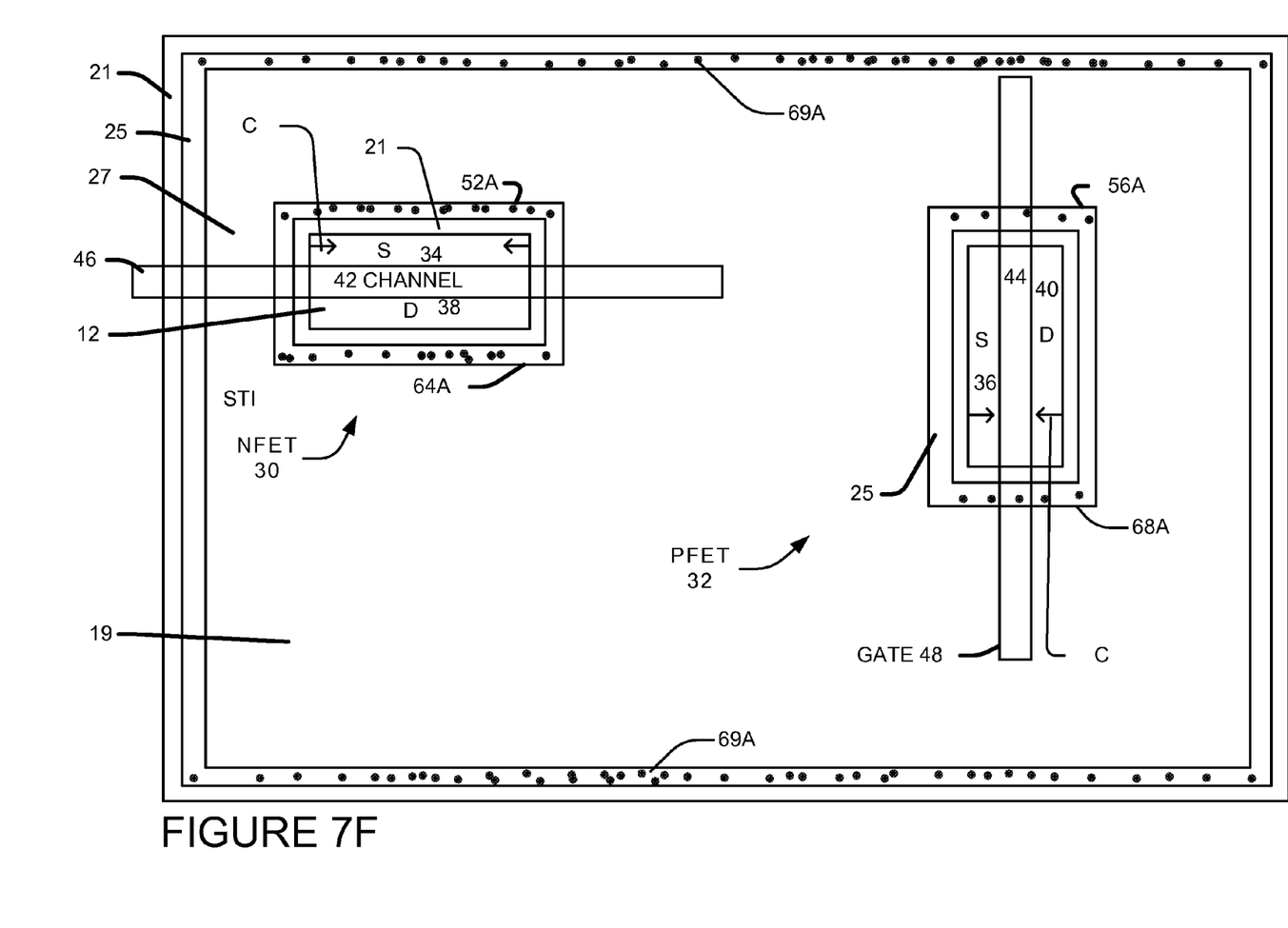

As shown in FIG. 7F, in another exemplary embodiment of the present invention, an N-FET (or N-MOSFET) 30 and P-FET (or P-MOSFET) 32 are formed in substrate 10 as generally described above.

In this exemplary embodiment however, instead of forming separate trenches 16, 18 surrounding one or more respective n-FETs 30 and p-FETs 32, a single (STI) trench 19 is formed to define the common active region 15 for the (one or more) n-FET 30 and (one or more) p-FET 32. Trench 19 extends between the outer sidewalls and to the sidewalls of the N-FET 30 and P-FET 32 (each having oxide liner 21 and (nitride) liner 25).

STI trench 19 is filled with an isolation layer 27 which may be formed of an oxide, for example.

Oxide liners 21 may be, for example, the oxides of underlying substrate 10. For example, for a silicon substrate 10, oxide liner 21 may be comprised of silicon oxide. Oxide liners 21 may be formed by, for example, oxidation of the exposed STI trench walls. Each oxide liner 21 may have a thickness of, for example, from about 10 to 110 angstroms, and more preferably from about 50 to 80 angstroms. Liners 21 may be comprised of other suitable materials.

Respective inherent tensile stress (e.g., nitride) liners 25 are formed over respective sidewalls of trench 19 and over respective oxide liners 21. Stress liners 25 may be comprised of, for example, silicon nitride, silicon oxynitride or a silicon nitride/silicon oxynitride stack and are preferably silicon nitride.

Each nitride liner 25 may have a thickness of, for example, from about 50 to 250 angstroms, preferably from about 75 to 125 angstroms and more preferably about 100 angstroms. Nitride liners 25 each may have an inherent stress (as will be discussed in greater detail below) which in turn exerts a substantially uniaxial stress into respective N-MOSFET channel(s) and P-MOSFET channel(s). For example, an inherent tensile nitride liner 25 exerts a compressive stress within respective N-MOSFET and P-MOSFET channels 42, 44.

For example, a compressive stress within N-MOSFET channel 42 degrades the N-MOSFET Idsat (reducing its electron mobility) while a compressive stress within P-MOSFET channel 44 improves the P-MOSFET Idsat (enhancing its hole mobility). This is true for either a high compressive stress (HS), that is a stress of greater than about −2 Gpa, or a low compressive stress (LS), that is a stress of from about −0.2 GPa to −0.5 GPa. It is noted that a further adverse effect of high STI stress is the possibility of the formation of (silicon) defects that could propagate along the STI edge during the STI process and leading to leakage issues and serious yield concerns.

The one or more n-FETs 30 and p-FETs 32 are formed so that their respective gates 46, 48 are roughly orthogonal (at a roughly 90 degree angle) to each other. That is, each and every n-FET gate 46 is roughly orthogonal to each and every p-FET gate 48 as shown in FIG. 7F.

While only single devices 30, 32 are shown in FIG. 7F, one skilled in the art would recognize that multiple (e.g. thousands) of such devices may be formed in accordance with the teachings of the present invention.

Other subsequent steps may be employed such as forming contacts, etc.

P. Non-Limiting Example Embodiments

It is noted that in another exemplary embodiment of the present invention, a mask, such as a photoresist mask, for example, may be formed over the portions of the trench(es) (sidewalls and/or bottom) 16, 18; 117 not to be ion implanted in conjunction with, or instead of, employing an angled ion-implant.

The steps may be performed in any order that achieves the result. There may be advantages in performing the steps in a specific order.

In the above description numerous specific details are set forth such as flow rates, pressure settings, thicknesses, etc., in order to provide a more thorough understanding of the present invention. Those skilled in the art will realize that power settings, residence times, gas flow rates are equipment specific and will vary from one brand of equipment to another. It will be obvious, however, to one skilled in the art that the present invention may be practiced without these details. In other instances, well known process have not been described in detail in order to not unnecessarily obscure the present invention.

Unless explicitly stated otherwise, each numerical value and range should be interpreted as being approximate as if the word "about" or "approximately" preceded the number of the value or range.

Given the variety of example embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

We claim:

1. A method of forming a semiconductor structure, comprising the steps of:

providing a substrate;

forming a trench within the substrate, the trench having opposing sidewalls;

forming a stress layer over the opposing trench sidewalls, the stress layer having an inherent stress; the stress layer having stress layer sidewalls over the trench sidewalls;

implanting ions into one or more portions of the stress layer to form ion-implanted relaxed portions; the portions of the stress layer that are not implanted are un-implanted portions; whereby the inherent stress of the one or more ion-implanted relaxed portions is relaxed;

forming at least one P-metal-oxide semiconductor field effect transistor (P-MOSFET) proximate the trench, the at least one P-MOSFET including a channel region having a channel width that roughly parallels the one or more ion-implanted relaxed portions; and forming at least one N-metal-oxide semiconductor field effect transistor (N-MOSFET) proximate the trench, the at least one N-MOSFET including a channel region having a channel width that is roughly perpendicular to the one or more ion-implanted relaxed portions, the stress layer having an inherent tensile stress.

2. The method of claim 1 which further comprises annealing the one or more ion-implanted relaxed portions; the stress layer has an inherent tensile stress.

3. The method of claim 1 which further comprises the ion implant comprises implanting with a ion that reduces the stress in the stress layer after implant and substantially retains the relaxed stress in the stress layer after subsequent anneals;

annealing the one or more ion-implanted relaxed portions; the anneal of the ion-implanted relaxed portions is performed at a temperature greater than about 750 degrees C.

4. The method of claim 1 wherein the ion-implanted relaxed portions have a boron (B) concentration of from about 1 E15 to 2E15 atoms/cm$^3$.

5. The method of claim 1 wherein the stress layer has inherent tensile stress of the stress layer is from about 0.5 to 1.4 GPa and the stress of the one or more relaxed portions is from about 0.0 to 0.2 GPa.

6. The method of claim 1 wherein the one or more ion-implanted relaxed portions has a stress that is from about 0% to 40% of the inherent tensile stress of the stress layer.

7. The method of claim 1 which further comprises the steps of:

forming a first liner over the trench and under the stress layer;

filling the trench with a dielectric layer over the stress layer; and forming a field effect transistor in the active area.

8. The method of claim 1 wherein the stress layer is comprised of silicon nitride and the un-implanted portions exert a stress into proximate portions of the substrate.

9. The method of claim 1 wherein the trench is comprised of a first section and a second section; the first section being aligned roughly orthogonally to the second section; the trench defining an active region of the substrate where a transistor can be formed; and the implanting of the ions is an angled ion implant so that the ions are substantially implanted into the stress layer sidewalls in the first section and substantially not implanted into stress layer sidewalls in the second section.

10. The method of claim 1 wherein the implanted ions comprise boron containing ions.

11. The method of claim 1 which further comprises annealing the one or more ion-implanted relaxed portions and wherein:

the implanted ions comprise boron (B) containing ions implanted at a dosage of from about 1 E 15 to 2 E 15 atoms/cm$^2$ and at an energy of from about 3 to 10 Keys;

the one or more ion-implanted relaxed portions have a boron ion concentration from about 1 E 15 to 2 E 15 atoms/cm$^3$; and the anneal of the ion-implanted relaxed portions is performed at temperature greater than about 750 degrees C.

12. The method of claim 1 further comprising the steps of:

forming a first liner over the trench and under the stress layer; and filling the trench with a dielectric layer over the stress layer.

13. The method of claim 1 further comprising the step of forming at least one P-metal-oxide semiconductor field effect transistor (P-MOSFET) proximate the trench, the at least one P-MOSFET including a channel region having a channel width that roughly parallels the one or more ion-implanted relaxed portions, the stress layer having an inherent tensile stress.

14. The method of claim 1 further comprising the step of forming at least one N-metal-oxide semiconductor field effect transistor (N-MOSFET) proximate the trench, the N-MOSFET including a channel region having a channel width that is roughly perpendicular to the one or more ion-implanted relaxed portions, the stress layer having an inherent tensile stress.

15. The method of claim 1 wherein the stress layer is comprised of nitride, silicon nitride or siliconoxynitride.

16. The method of claim 1 wherein each of the one or more ion-implanted relaxed portions are roughly parallel to each other and are each roughly perpendicular to each of the one or more un-implanted portions which are roughly parallel to each other.

17. A method of forming a semiconductor structure, comprising the steps of:
    providing a substrate;
    forming a trench within the substrate, the trench having opposing sidewalls;
    forming a stress layer over the opposing trench sidewalls, the stress layer having an inherent stress; the stress layer having stress layer sidewalls over the trench sidewalls;
    implanting ions into one or more portions of the stress layer to form ion-implanted relaxed portions; whereby the inherent stress of the one or more ion-implanted relaxed portions of stress layer portions is relaxed;
    forming at least one P-metal-oxide semiconductor field effect transistor (P-MOSFET) proximate the trench, the at least one P-MOSFET including a channel region having a channel width that roughly parallels the one or more ion-implanted relaxed portions; and
    forming at least one N-metal-oxide semiconductor field effect transistor (N-MOSFET) proximate the trench, the at least one N-MOSFET including a channel region having a channel width that is roughly perpendicular to the one or more ion-implanted relaxed portions.

18. The method of claim 17 which further comprises annealing the one or more ion-implanted relaxed portions; the stress layer having an inherent tensile stress.

19. The method of claim 17 further comprising the step of annealing the one or more ion-implanted relaxed portions at a temperature greater than about 750 degrees C.

20. The method of claim 17 further comprising the step of annealing the one or more ion-implanted relaxed portions;
    the ions are comprised of boron containing ions,
    the stress layer having an inherent tensile stress of from about 0.5 to 1.4 GPa, and the stress of the one or more ion-implanted relaxed portions is from about 0.0 to 0.2 GPa.

21. The method of claim 17 wherein the ion-implanted relaxed portions have a boron (B) concentration of from about 1E15 to 2E15 atoms/cm$^3$.

22. The method of claim 17 wherein the trench defines an active region of the substrate wherein a field effect transistor can be formed, the field effect transistor being formed by the steps comprising:
    forming a first liner over the trench and under the stress layer;
    filling the trench with a dielectric layer over the stress layer; and
    forming a field effect transistor in the active area.

23. A method of forming a semiconductor structure, comprising the steps of:
    providing a substrate;
    forming a first and second trench within the substrate, the first and second trenches each having opposing trench sidewalls;
    forming a stress layer over the respective first and second opposing trench sidewalls, the stress layer having an inherent tensile stress;
    implanting ions into one or more portions of the stress layer at a predetermined angle:
        i) to form first ion-implanted stress layer portions over the first trench;
        ii) to form second ion-implanted stress layer portions over the second trench; and
        iii) leaving first un-implanted stress layer portions over the first trench and
    second un-implanted stress layer portions over the second trench;
    whereby the inherent stress of the first and second ion-implanted stress layer portions is relaxed; the first and second ion-implanted stress layer portions being roughly perpendicular to the first and second un-implanted stress layer portions; and
    forming:
        a) at least one P-metal-oxide semiconductor field effect transistor (P-MOSFET) proximate the first trench, the P-MOSFET including a channel region having a channel width that is roughly parallel to the first ion-implanted relaxed stress layer portions; or
        b) at least one N-metal-oxide semiconductor field effect transistor (N-MOSFET) proximate the second trench, the N-MOSFET including a channel region having a channel width that is roughly perpendicular to the second ion-implanted relaxed stress layer portions.

24. The method of claim 23 wherein the ions are implanted at an angled ion implant, and wherein the first and second trenches are connected.

25. The method of claim 23 wherein the ions are implanted at an angle of about 7 degrees.

26. The method of claim 23 wherein the first and second ion-implanted stress layer portions have a boron (B) concentration of from about 1E15 to 2E15 atoms/cm$^3$.

27. The method of claim 23 wherein the stress layer has an inherent tensile stress of from about 0.5 to 1.4 GPa and the stress of the first and second relaxed stress layer portions is from about 0.0 to 0.2 GPa.

28. The method of claim 23 further comprising the step of:
    annealing the first and second ion-implanted stress layer portions at a temperature of greater than about 750 degrees C.;
the implanted ions comprise boron (B) containing ions implanted at a dosage of about 1E15 to 2E15 atoms/cm$^2$ and at an energy of from about 3 to 10 Keys, and the ion-implanted first and second ion implanted stress layer portions have a B ion concentration of from about 1E15 to 2E15 atoms/cm$^3$.

29. The method of claim 23 further comprising the steps of:
    forming a first liner over the trench and under the stress layer; and
    filling the trench with a dielectric layer over the stress layer.

30. The method of claim 23 further comprising the step of annealing the first and second ion-implanted stress layer portions at a temperature of greater than about 750 degrees C.

31. The method of claim 23 wherein the stress layer is comprised of silicon nitride and the un-implanted first and second stress layer portions each exert a stress into proximate portions of the substrate.

32. The method of claim 23 including the step of forming both at least one P-MOSFET proximate the first trench and at least one N-MOSFET proximate the second trench.

33. A method of forming a device comprising:
providing a substrate prepared with a first device region and a trench surrounding the device region;
forming a stress layer lining the sidewalls and bottom of the trench, the stress layer having a first stress; and
implanting stress relaxing ions into the stress layer to relax the first stress to a second relaxed stress, wherein the stress relaxing ions cause the stress layer with the second relaxed stress to remain relaxed when exposed to subsequent annealing processes.

34. The method of claim 33 wherein the stress relaxing ions comprises B containing ions.

35. The method of claim 34 comprises annealing the stress layer, wherein the stress layer with the second relaxed stress remains relaxed after annealing.

36. The method of claim 34 wherein the stress layer comprises silicon nitride.

37. The method of claim 36 wherein the stress layer comprises silicon nitride and the B containing ions form B—N bonds in the stress layer.

38. The method of claim 33 wherein the stress relaxing ions comprises B, $BF_2$ or $B_2F_2$.

39. The method of claim 38 comprises annealing the stress layer, wherein the stress layer with the second relaxed stress remains relaxed after annealing.

40. The method of claim 38 wherein the stress layer comprises silicon nitride.

41. The method of claim 40 wherein the stress layer comprises silicon nitride and the B containing ions form B—N bonds in the stress layer.

42. The method of claim 38 comprises annealing the stress layer, wherein the stress layer with the second relaxed stress remains relaxed after annealing.

43. The method of claim 38 wherein the stress layer comprises silicon nitride.

44. The method of claim 43 wherein the stress layer comprises silicon nitride and the B containing ions form B—N bonds in the stress layer.

45. The method of claim 33 comprises filling the trench with a dielectric material to form an isolation region surrounding the device region.

46. The method of claim 33 wherein the first stress comprises a tensile stress.

47. The method of claim 46 wherein implanting the stress relaxing ions comprises performing implanting the stress relaxing ions at an angle to implant the stress relaxing ions into one opposing sidewall of the stress layer perpendicular to a channel of a transistor which is to be formed in the device region.

48. The method of claim 47 wherein the transistor comprises a n-type transistor.

49. The method of claim 46 wherein implanting the stress relaxing ions comprises performing implanting the stress relaxing ions at an angle to implant the stress relaxing ions into one opposing sidewall of the sidewalls of the stress layer parallel to a channel of a transistor which is to be formed in the device region.

50. The method of claim 49 wherein the transistor comprises a p-type transistor.

51. The method of claim 46 wherein implanting the stress relaxing ions comprises performing implanting the stress relaxing ions at an angle to implant the stress relaxing ions into portions of the sidewalls of the stress layer perpendicular to a channel of a transistor which is to be formed in the device region.

52. The method of claim 51 wherein the transistor comprises a n-type transistor.

53. The method of claim 46 wherein implanting the stress relaxing ions comprises performing implanting the stress relaxing ions at an angle to implant the stress relaxing ions into portions of the sidewalls of the stress layer parallel to a channel of a transistor which is to be formed in the device region.

54. The method of claim 53 wherein the transistor comprises a p-type transistor.

55. A method of forming a device comprising:
providing a substrate prepared with a stress layer having a first stress; and
implanting stress relaxing ions into the stress layer to relax the first stress to a second relaxed stress, wherein the stress relaxing ions cause the stress layer with the second relaxed stress to remain relaxed when exposed to subsequent annealing processes.

* * * * *